US012457716B2

United States Patent
Verhoog

(10) Patent No.: US 12,457,716 B2
(45) Date of Patent: Oct. 28, 2025

(54) COOLING MODULE COMPRISING A COOLING STRUCTURE FOR DISSIPATION OF HEAT

(71) Applicant: Valeo Siemens eAutomotive France SAS, Cergy (FR)

(72) Inventor: Roelof Verhoog, Cergy (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 17/730,983

(22) Filed: Apr. 27, 2022

(65) Prior Publication Data
US 2022/0354028 A1 Nov. 3, 2022

(30) Foreign Application Priority Data

Apr. 29, 2021 (FR) ........................................ 2104497

(51) Int. Cl.
*H05K 7/20* (2006.01)
*B33Y 80/00* (2015.01)

(52) U.S. Cl.
CPC ..... *H05K 7/20927* (2013.01); *H05K 7/20263* (2013.01); *B33Y 80/00* (2014.12)

(58) Field of Classification Search
CPC ........... H05K 7/20927; H05K 7/20263; H05K 7/2089; H05K 7/20218–20281; H05K 7/20845; H05K 7/20854; H05K 7/209; H05K 7/20872; H05K 7/20336; H05K 7/20936

See application file for complete search history.

(56) References Cited

U.S. PATENT DOCUMENTS

| 6,016,007 | A | 1/2000 | Sanger et al. | |
|---|---|---|---|---|
| 7,044,199 | B2 * | 5/2006 | Thayer | H01L 23/473 |
| | | | | 257/E23.098 |
| 9,420,731 | B2 * | 8/2016 | Hosseini | H01L 23/3736 |
| 10,068,832 | B2 * | 9/2018 | Han | F28D 15/0233 |
| 10,481,651 | B2 * | 11/2019 | Dede | G06F 1/26 |
| 10,986,754 | B2 * | 4/2021 | Lee | H05K 1/0204 |

(Continued)

FOREIGN PATENT DOCUMENTS

FR 3034592 A1 10/2016
KR 102202443 B1 * 1/2021

OTHER PUBLICATIONS

KR-102202443-B1 Translation.*

(Continued)

*Primary Examiner* — Jayprakash N Gandhi
*Assistant Examiner* — Matthew Sinclair Muir
(74) *Attorney, Agent, or Firm* — Osha Bergman Watanabe & Burton LLP

(57) ABSTRACT

The invention concerns an alveolar cooling structure (3) which is configured to dissipate the heat generated by at least one electronic component (40) placed on an upper surface (21) of a substrate (2), the alveolar cooling structure (3) being in contact with an inner surface (22) of the said substrate (2). The alveolar cooling structure (3) comprises cells, the cell edges of which increase a total contact surface between the alveolar cooling structure (3) and a cooling fluid; and pores which are defined by the cells and distributed in the volume of the alveolar cooling structure (3), the cooling fluid circulating through the pores and/or through the spaces between the pores.

16 Claims, 5 Drawing Sheets

(56) References Cited

U.S. PATENT DOCUMENTS

| | | | |
|---|---|---|---|
| 2002/0108743 A1* | 8/2002 | Wirtz | H01L 23/3733 |
| | | | 257/722 |
| 2003/0053294 A1 | 3/2003 | Yamada et al. | |
| 2003/0132040 A1 | 7/2003 | Radosevich et al. | |
| 2005/0068738 A1* | 3/2005 | Kim | H10K 59/8794 |
| | | | 257/E23.112 |
| 2005/0259396 A1 | 11/2005 | Barson et al. | |
| 2006/0108103 A1* | 5/2006 | Yu | F28D 15/0233 |
| | | | 165/104.26 |
| 2008/0044621 A1 | 2/2008 | Strauss | |
| 2020/0103179 A1* | 4/2020 | Coppola | F28F 3/02 |
| 2020/0383238 A1* | 12/2020 | Chan | H05K 7/20254 |
| 2021/0329815 A1* | 10/2021 | Kim | H05K 7/20936 |
| 2022/0015258 A1* | 1/2022 | Manninen | H01L 23/427 |

OTHER PUBLICATIONS

Preliminary Search Report issued in corresponding French Patent Application No. 2104497, dated Dec. 3, 2021 (9 pages).
Office Action issued in corresponding European U.S. Appl. No. 22/170,117 mailed Oct. 11, 2024 (2 pages).

* cited by examiner

COOLING MODULE COMPRISING A COOLING STRUCTURE FOR DISSIPATION OF HEAT

TECHNICAL FIELD AND SUBJECT MATTER OF THE INVENTION

The present invention relates to the field of electrical equipment, in particular for vehicles, in particular for electric vehicles (EV) or hybrid vehicles (HEV).

More particularly, the invention concerns a cooling structure used in a cooling module, the cooling structure being configured to dissipate efficiently the heat generated by electronic components of an electronic module.

PRIOR ART

An electronic module for an electric or hybrid vehicle, for example an electronic power module, comprises electronic components which are in general placed on a substrate of the electronic module. During the operation of the electronic module, the electronic components produce heat, and must be cooled in order to be operational. Efficient cooling of the electronic components makes it possible in particular to increase the service life of the electronic components. The electronic module thus comprises a cooling module in order to dissipate the heat generated by these electronic components.

In general, the substrate comprises an upper surface on which the electronic components are placed, and a lower surface which is in contact with the cooling module, in which a cooling fluid (e.g. water) circulates. The heat which is generated by the electronic components is transmitted from the substrate to the cooling module, and is then discharged by the cooling fluid circulated.

In addition, the cooling module can comprise cooling spindles which are immersed in the cooling fluid. The cooling spindles are in general made of metal, and thus facilitate the exchange of heat, as well as the dissipation of heat. However, the efficiency of the dissipation of heat provided by a cooling module of this type must be further improved.

There is therefore a need for improvement of the cooling of the electronic components of an electronic module, by means of a cooling structure which has good resistance to thermal shocks, high temperatures, humidity, and high pressures.

GENERAL DESCRIPTION OF THE INVENTION

The present invention concerns an alveolar cooling structure which is configured to dissipate the heat generated by at least one electronic component placed on an upper surface of a substrate, the alveolar cooling structure being in contact with an inner surface of the said substrate. The alveolar cooling structure comprises cells, the cell edges of which increase a total contact surface between the alveolar cooling structure and a cooling fluid; and pores which are defined by the cells and distributed in the volume of the alveolar cooling structure, the cooling fluid circulating through the pores and/or through the spaces between the pores.

Advantageously, the alveolar cooling structure is produced by 3D printing.

Advantageously, the cells are of the open and/or closed type, the pores being of the interconnected and/or sealed type.

Preferably, the alveolar cooling structure is in contact with a contact area of the lower surface, as well as being immersed in the cooling fluid.

Preferably, the alveolar cooling structure comprises portions which are connected respectively to contact areas and/or to contact points distributed in the contact area of the lower surface.

Advantageously, the alveolar cooling structure is in a single piece comprising the portions, or, alternatively, the portions of the alveolar cooling structure are independent from one another.

Advantageously, the alveolar cooling structure is in the form of a pipe coil.

Preferably, the alveolar cooling structure has porosity of between 75% and 95% of the volume of the alveolar cooling structure.

Preferably, the alveolar cooling structure is constituted by a material with thermal conductivity which is greater than that of the cooling fluid.

Advantageously, the alveolar cooling structure is connected to the contact area of the lower surface by sintering, welding, gluing, or by compression.

Advantageously, the alveolar cooling structure is formed together with the substrate by 3D printing.

The invention also concerns a cooling module for an electronic module, in particular for an electric or hybrid motor vehicle, which module is configured to dissipate the heat generated by the electronic module. The cooling module comprises at least one alveolar cooling structure as described above, the at least one alveolar cooling structure being in contact with at least one substrate of the electronic module.

Advantageously, the cooling module comprises at least one chamber which is configured to contain a cooling fluid, and the at least one alveolar cooling structure.

Advantageously, the cooling module comprises the cooling fluid.

The invention also concerns an electronic module which is designed to be incorporated in an electrical assembly of an electric or hybrid motor vehicle. The electronic module comprises at least one substrate comprising an upper surface and a lower surface; at least one electronic component placed on the upper surface of the at least one substrate; a cooling module as described above, the cooling module being in contact with the lower surface of the at least one substrate, and comprising at least one alveolar cooling structure which is in contact with the lower surface of the at least one substrate.

The electronic module is for example an electronic power module, wherein the at least one electronic component is a semiconductor power chip.

The invention concerns an electrical assembly for an electric or hybrid motor vehicle, comprising an electronic module as described above.

The electronic module is for example an inverter or a direct-direct voltage converter.

PRESENTATION OF THE FIGURES

The invention will be better understood by reading the following description, provided by way of example and with reference to the following figures, provided by way of non-limiting examples, in which identical references are given to similar objects.

It should be noted that the figures set out the invention in detail for implementing the invention, and it will be appreciated that it is possible for the said figures to serve to define the invention better if necessary.

DETAILED DESCRIPTION OF THE INVENTION

In general, the invention thus concerns an alveolar cooling structure 3 which is designed to be placed in a cooling module 5 of an electronic module 10, in order to dissipate the heat generated by at least one electronic component 40 of the electronic module 10.

Figure 1:
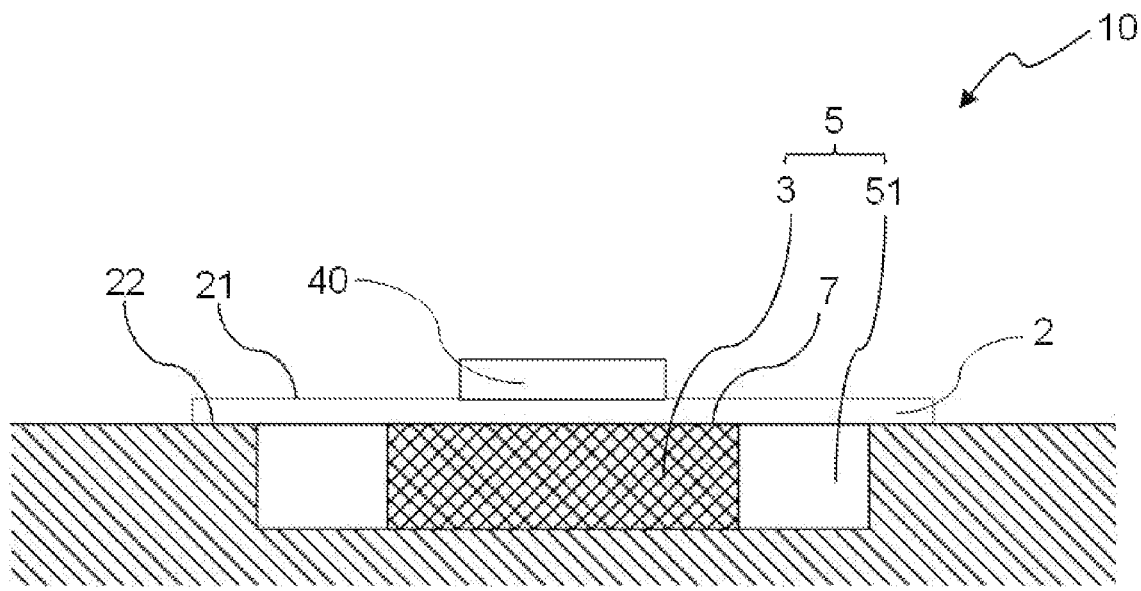
FIG. 1 illustrates a view in transverse cross-section of an electronic module equipped with a cooling module comprising an alveolar cooling structure, according to an embodiment of the invention.
Figure 2:
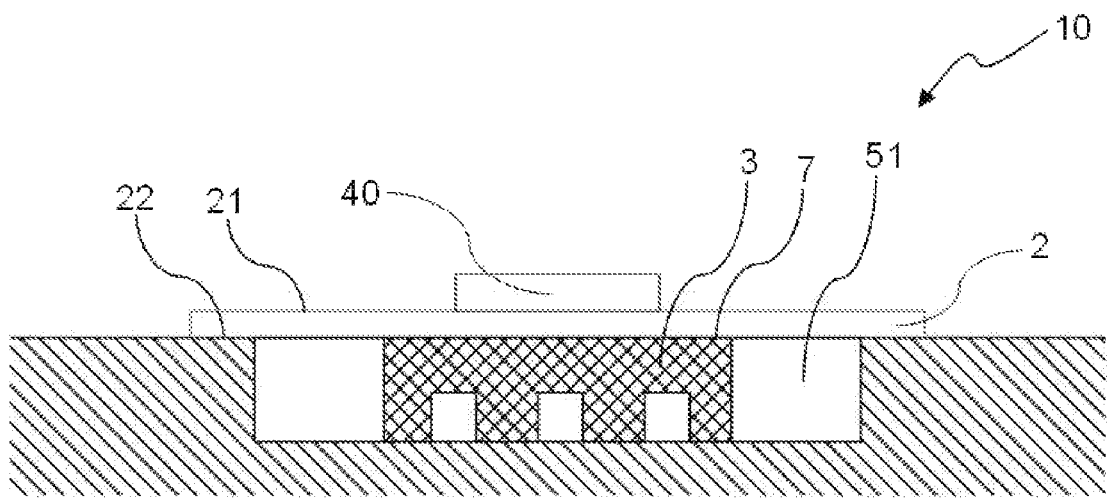
FIGS. 2 and 3 illustrate the electronic module equipped with the structures with various forms according to the invention.

FIG. 1 illustrates a view in transverse cross-section of the electronic module 10, equipped with a cooling module 5 having at least one alveolar cooling structure 3, according to an embodiment of the invention.

The electronic module 10 comprises the at least one electronic component 40, at least one substrate 2 on which the at least one electronic component 40 is placed, and the cooling module 5. The electronic module 10 is preferably an electronic power module. The electronic module 10 is designed in particular to be incorporated in an electrical assembly on board an electric or hybrid motor vehicle. The electrical assembly is for example an inverter or a direct-direct voltage converter.

The at least one electronic component 40 is in particular a semiconductor power chip. In most cases, the electronic module 10 comprises a plurality of electronic components 40. However, in order to facilitate reading of the text, in most of the embodiments illustrated hereinafter, the electronic module 10 comprises a single substrate 2 and a single electronic component 40.

The substrate 2 preferably has a multilayer structure. According to one embodiment, the substrate 2 comprises a metal layer. The invention is not limited either to the number of layers or to the materials of layers of the substrate 2. Preferably, the substrate 2 is produced by 3D (three-dimensional) printing.

The substrate 2 has an upper surface 21 and a lower surface 22. The two surfaces 21 and 22 are flat. The at least one electronic component 40 is placed on the upper surface 21, whereas the lower surface 22 is in contact with the cooling module 5.

The cooling module 5 comprises at least one chamber 51, which is configured to contain a cooling fluid and the at least one alveolar cooling structure 3. In most of the embodiments illustrated hereinafter, the cooling module 5 comprises a single chamber 51 and a single alveolar cooling structure 3.

Preferably, the cooling fluid circulates through the chamber 51. In particular, after having fitted the substrate 2 on the cooling module 5 in a sealed manner, the alveolar cooling structure 3 is placed in the chamber 51. The cooling fluid is for example water or liquid glycol.

Figure 5:
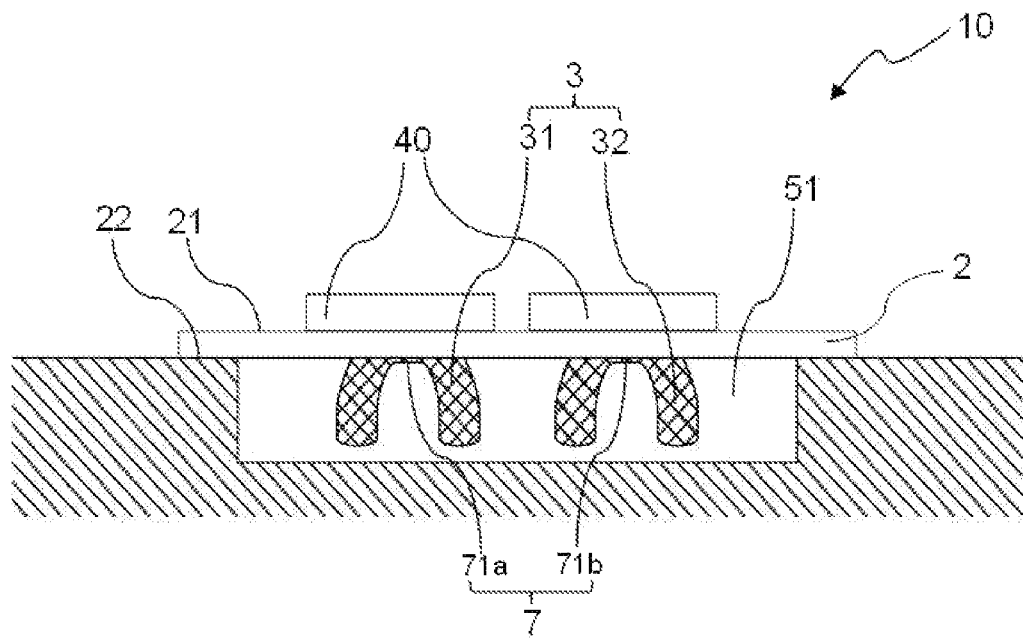
Figure 6:
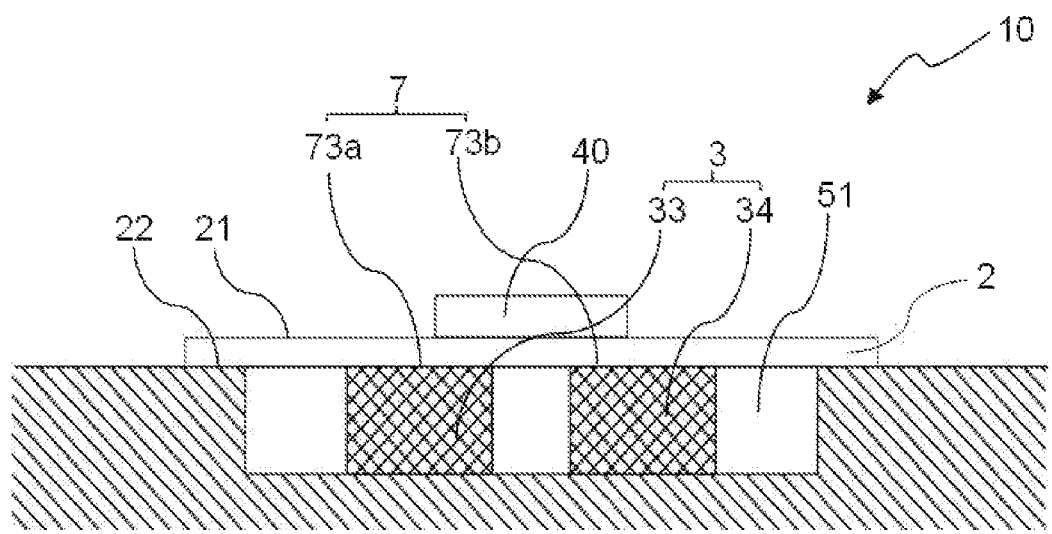
FIG. 6 illustrates the alveolar cooling structure comprising portions which are independent from one another, according to an embodiment of the invention.
Figure 7:
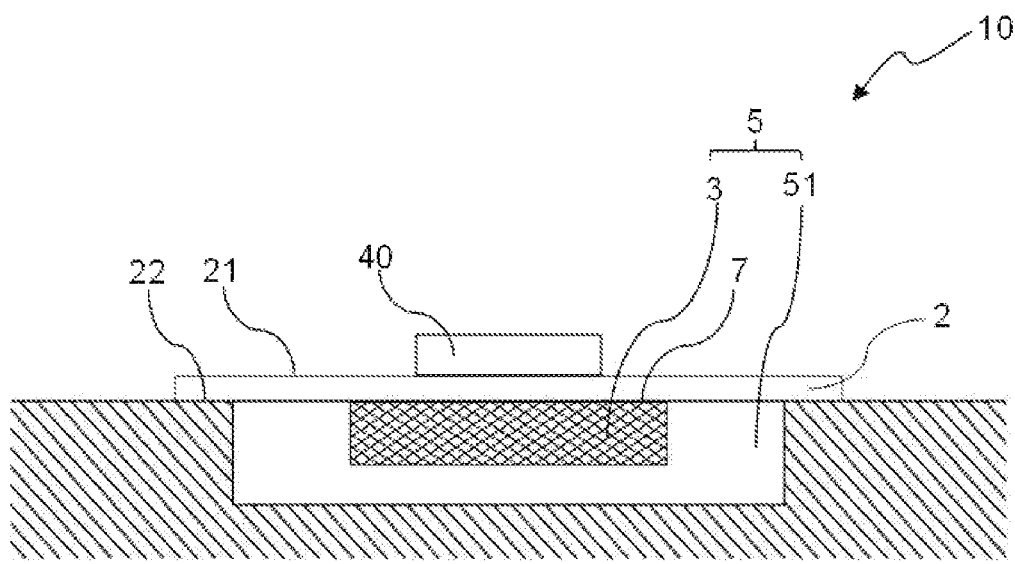
FIG. 7 illustrates the alveolar cooling structure, according to an embodiment of the invention, not in contact with the base of the chamber of the cooling module.

The alveolar cooling structure 3 is placed in the chamber 51, and is immersed in the cooling fluid. The alveolar cooling structure 3 is for example in contact with the base of the chamber 51, as illustrated in FIG. 1. Alternatively, the alveolar cooling structure 3 is not in contact with the base of the chamber 51, as illustrated in FIGS. 5 and 7.

The alveolar cooling structure 3 is constituted by a metal material, such as aluminium, steel, copper, magnesium, nickel and titanium, or by an alloy containing one or a plurality of the aforementioned metals. In particular, the material of the alveolar cooling structure 3 has thermal conductivity greater than that of the cooling fluid.

The alveolar cooling structure 3 comprises cells and pores which are defined by these cells. The cells and the pores are distributed in the volume of the alveolar cooling structure 3. Preferably, the cells and pores are regularly distributed in the said volume. Advantageously, the alveolar cooling structure 3 has porosity of between 75% and 95% of the said volume. The size of the pores and the porosity of the alveolar cooling structure 3 are adapted to the production requirements.

The pores are designed to be filled by the cooling fluid. The cells can be of the open and/or closed type. In other words, the alveolar cooling structure 3 can comprise a combination of open and closed cells, or, alternatively, only open cells or only closed cells. The pores are consequently of the interconnected and/or sealed type. The alveolar cooling structure 3 can comprise a combination of interconnected and sealed pores, or, alternatively, only the interconnected pores (which are the open pores defined by the open cells) or only the sealed pores (defined by the closed cells).

According to an advantageous embodiment (not illustrated in the figures), the alveolar cooling structure 3 is a block of metal or alloy pierced by a plurality of intersecting holes. A pore is formed such that three holes of the said block intersect at a single point.

The alveolar cooling structure 3 is preferably in contact with a contact area 7 of the lower surface 22 of the substrate 2 in order to increase the efficiency of the dissipation of the heat generated by the at least one electronic component 40. The heat generated is transmitted from the substrate 2 through the contact area 7 to the alveolar cooling structure 3, and is then discharged by the cooling fluid circulated.

Preferably, the alveolar cooling structure 3 is produced by 3D printing.

Edges of the cells of the alveolar cooling structure 3 increase the heat-exchange surface considerably. The heat-exchange surface is the surface of total contact between the alveolar cooling structure 3 and the cooling fluid. In addition, the cooling fluid circulates through spaces between the sealed pores and/or, more advantageously, through the interconnected pores, which thus increases the permeability to the fluid. The increase in the heat-exchange surface and the permeability to the fluid thus makes it possible to improve the thermal conductivity as well as the dissipation of heat.

The alveolar cooling structure 3 can be connected to the contact area 7 of the lower surface 22, for example by sintering, welding, gluing, or by compression According to one embodiment, the alveolar cooling structure 3 can be compressed in order to decrease its volume (in particular in order to decrease its volume by 30%), so as to adapt to the production requirements (e.g. the form and/or the size of the chamber 51, the location, form and/or size of the contact area 7).

Advantageously, the at least one substrate 2 and the at least one alveolar cooling structure 3 form an assembly. This assembly is preferably produced by 3D printing. The said assembly, in particular the one produced by 3D printing, prevents the problem of joining (situated in the said contact area 7) of the alveolar cooling structure 3 and the substrate 2, which thus improves the efficiency of cooling.

Figure 3:
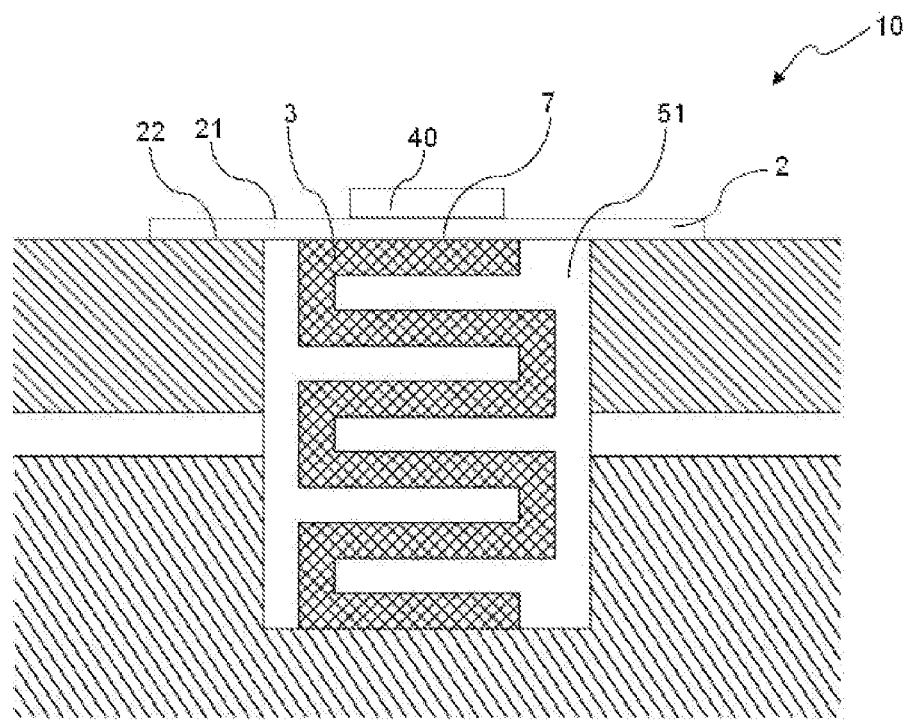

FIGS. 2 to 7 illustrate the electronic module 10 equipped with the alveolar cooling structures 3 with various forms and configurations, according to the invention. The structures 3 described in FIGS. 2 to 6, in particular the one in the form of a pipe coil as represented in FIG. 3, have respectively a heat-exchange surface which is greater than that of the alveolar cooling structure 3 described in FIG. 1.

According to one embodiment, the alveolar cooling structure 3 is in a single piece, with a predetermined form, as described in FIGS. 1 to 4, 7 and 8. Alternatively, the alveolar cooling structure 3 comprises a plurality of portions which are independent from one another, as described in FIGS. 5 and 6. The alveolar cooling structure 3 in FIG. 5 has independent portions 31, 32 which are respectively in contact with the lower surface 22 of the substrate 2, at contact points 71a, 71b distributed in the contact area 7. The alveolar cooling structure 3 in FIG. 6 has independent portions 33, 34 which are respectively in contact with the lower surface 22 of the substrate 2, at contact areas 73a, 73b, which constitute the contact area 7. The invention is not limited to the number or forms of portions of the alveolar cooling structure 3, or to the number or forms of the contact regions, or to the number of contact points.

According to one embodiment (not illustrated in the figures), where the alveolar cooling structure 3 occupies all of the chamber 51 of the cooling module 5, the cooling fluid circulates only through the alveolar cooling structure 3. Alternatively, as described in FIGS. 1 to 9, a portion of the cooling fluid circulates through the alveolar cooling structure 3, whereas the remainder of the cooling fluid circulates around the alveolar cooling structure 3, for example through spaces between the alveolar cooling structure 3 and inner walls of the chamber 51, and/or through spaces between the alveolar cooling structure 3 and the lower surface 22, and/or through the spaces between the different portions of the alveolar cooling structure 3.

Figure 4:
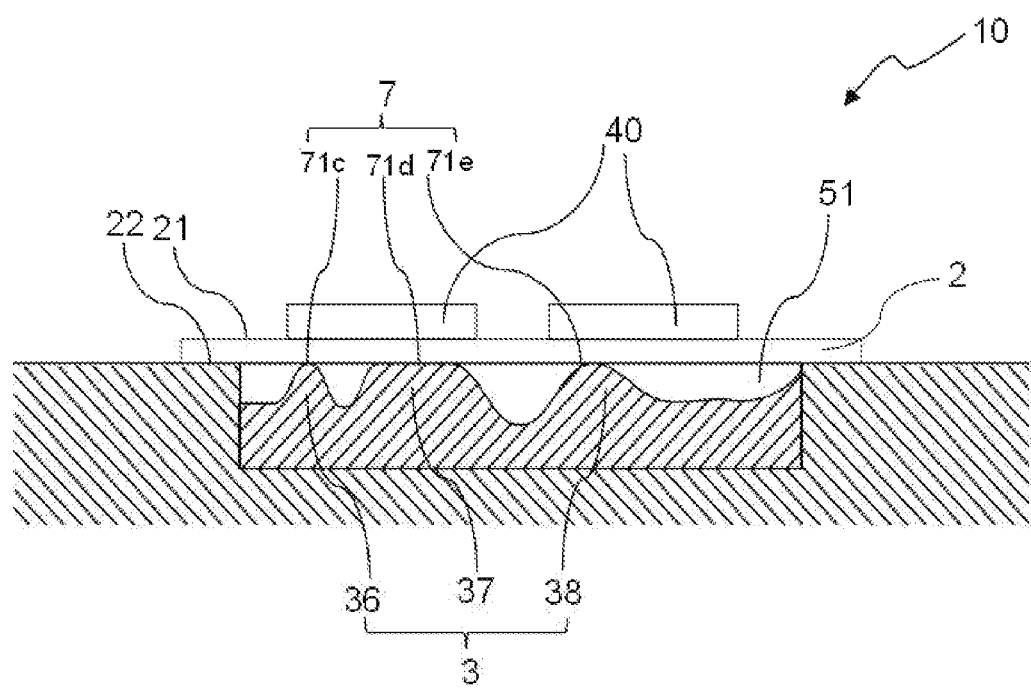
FIGS. 4 and 5 illustrate, according to the invention, the alveolar cooling structure connected to contact points of the substrate of the electronic module.

As stated above, FIG. 5 illustrates the alveolar cooling structure 3 comprising the independent portions 33, 34 connected to the contact points 71a, 71b distributed in the contact area 7. Preferably, the alveolar cooling structure 3 is connected (e.g. is welded) to the contact points distributed in the contact area 7 of the lower surface 22 of the substrate on which the electronic components 40 are placed. The portions 33 and 34, preferably in the form of a curved strip, have respectively a thickness. Preferably, these contact points are situated respectively in the vicinity of an area with a higher temperature, for example below one of the electronic components 40, such as to increase the efficiency of the dissipation of heat. In addition, according to an alternative embodiment, as illustrated in FIG. 4, the alveolar cooling structure 3 is in a single piece comprising portions 36, 37, 38, which are respectively connected to one or a plurality of the contact points 71c, 71d, 71e distributed in the contact area 7, instead of being in contact with the entire contact area 7.

According to an advantageous embodiment (not illustrated in the figures), the alveolar cooling structure 3 comprises a first portion and a second portion which is independent from the first portion. The first portion is in contact with the lower surface 22 in a contact region. The second portion comprises sub-portions (which are or are not independent), respectively connected to one or a plurality of contact points. The contact points and the contact region constitute the contact area 7.

Figure 8:
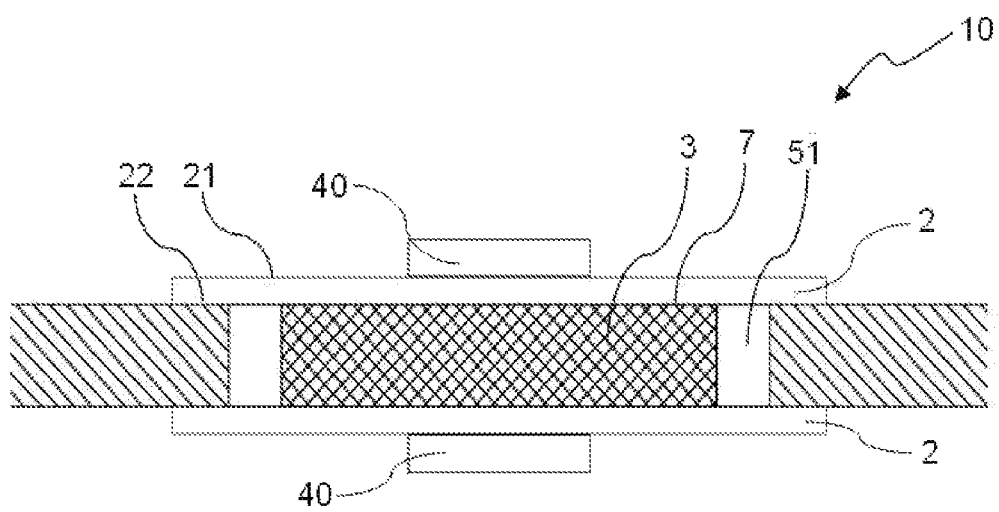
FIG. 8 illustrates the cooling module comprising a single alveolar cooling structure used to cool the electronic components placed on two substrates, according to an embodiment of the invention.

FIG. 8 illustrates an embodiment of the invention in which the electronic module 10 comprises two substrates 2, and electronic components 40 placed on the two substrates 2. The cooling module 5, which is situated between the two substrates 2, comprises a single alveolar cooling structure 3. The cooling module 5 is used to cool the electronic components 40 placed on the two substrates 2 placed respectively on both sides of the cooling module 5. The alveolar cooling structure 3 is in contact with the contact areas 7 of the said substrates 2. Advantageously, the two substrates 2 and the alveolar cooling structure 3 form an assembly which is preferably produced by 3D printing.

Figure 9:
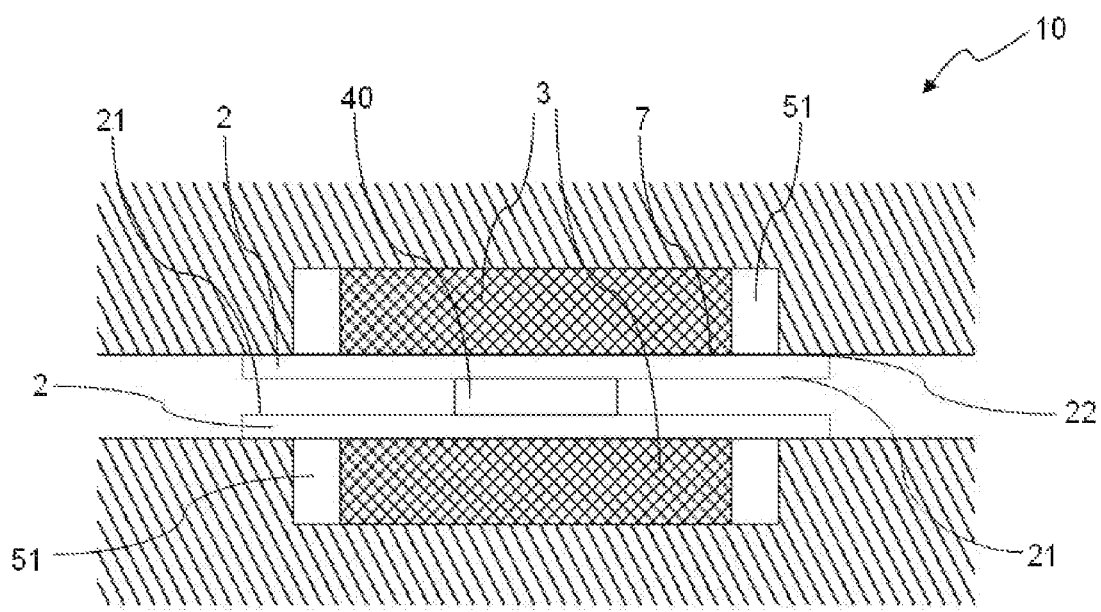
FIG. 9 illustrates the cooling module comprising two alveolar cooling structures used to cool at least one electronic component placed between the said alveolar cooling structures.

FIG. 9 shows another embodiment in which the electronic module 10 comprises two substrates 2, at least one electronic component 40, and a cooling module 5 comprising two chambers 51 and two alveolar cooling structures 3. The at least one electronic component 40 is placed between the two substrates 2, while being placed on the upper surfaces 21 of the said substrates 2. The alveolar cooling structures 3, in contact with the inner surfaces 22 of the said substrates 2, are configured to dissipate the heat generated by the at least one electronic component 40. The efficiency of cooling of the present embodiment is improved in comparison with the embodiments illustrated in FIGS. 1 to 8.

Preferably, in order to avoid the problem of joining described above, and to simplify the assembly of components of the electronic module 10, the at least one electronic component 40 is placed between, while being in contact with, two assemblies, each comprising one of the two alveolar cooling structures 3 and one of the two substrates 2. The said assemblies are preferably produced by 3D printing.

The invention also concerns other embodiments, which are combinations of two or more of the embodiments described above.

In comparison with the conventional cooling mechanisms (e.g. in the presence of a cooling fluid and with or without cooling spindles), the alveolar cooling structure 3 according to the present invention makes it possible to increase the heat exchange surface, and the permeability to the cooling fluid, which improves the thermal conductivity as well as the dissipation of heat. In addition, the alveolar cooling structure 3 is strong and easy to machine, with good resistance to thermal shocks, high temperatures, humidity and high pressures. In particular, the alveolar cooling structure 3 is also designated as a "foam", for example a metal foam.

The invention is not limited to the embodiments previously described, but extends to any embodiment which is in conformity with its spirit.

The invention claimed is:

1. Alveolar cooling structure which is configured to dissipate the heat generated by at least one electronic component placed on an upper surface of a substrate fitted over a chamber, the alveolar cooling structure being in contact with an inner surface of the said substrate, the alveolar cooling structure, comprising:
  cells, wherein cell edges of which increase a total contact surface between the alveolar cooling structure and a cooling fluid; and
  pores which are defined by the cells and distributed in the volume of the alveolar cooling structure, the cooling fluid circulating through the pores and/or through the spaces between the pores,
  wherein the alveolar cooling structure comprises a porosity of between 75% and 95% of the volume of the alveolar cooling structure, and
  wherein the alveolar cooling structure comprises independent portions connected to contact points distributed in contact areas of a lower surface of the substrate,
  wherein the alveolar cooling structure is in the form of a pipe coil, wherein the pipe coil is disposed within the chamber and connected with the lower surface of the substrate and a base of the chamber.

2. The alveolar cooling structure according to claim 1, being produced by 3D printing.

3. The alveolar cooling structure according to claim 1, being in contact with a contact area of the inner surface, as well as being immersed in the cooling fluid.

4. The alveolar cooling structure according to claim 3, comprising independent portions which are connected respectively to contact areas and/or to contact points distributed in the contact area of the inner surface.

5. The alveolar cooling structure according to claim 1, being constituted by a material having thermal conductivity which is greater than that of the cooling fluid.

6. The alveolar cooling structure according to claim 3, being connected to the contact area of the inner surface by sintering, welding, gluing, or by compression.

7. The alveolar cooling structure according to claim 1, being formed together with the substrate by 3D printing.

8. A cooling module for an electronic module for an electric or hybrid motor vehicle, the cooling module being configured to dissipate the heat generated by the electronic module, the cooling module comprising:
  at least one alveolar cooling structure according to claim 1, the at least one alveolar cooling structure being in contact with at least one substrate of the electronic module.

9. The cooling module according to claim 8, comprising at least one chamber which is configured to contain the cooling fluid, and the at least one alveolar cooling structure.

10. The cooling module according to claim 8, comprising the cooling fluid.

11. An electronic module which is designed to be incorporated in an electrical assembly of an electric or hybrid motor vehicle, the electronic module, comprising:
  at least one substrate comprising an upper surface and a lower surface;
  at least one electronic component placed on the upper surface of the at least one substrate; and
  a cooling module according to claim 8, the cooling module being in contact with the lower surface of the at least one substrate and comprising at least one alveolar cooling structure which is in contact with the lower surface of the at least one substrate.

12. The electronic module according to claim 11, being an electronic power module, wherein the at least one electronic component is a semiconductor power chip.

13. The electrical assembly for an electric or hybrid motor vehicle, comprising an electronic module according to claim 11.

14. The electrical assembly according to claim 13, being an inverter or a direct-direct voltage converter.

15. The alveolar cooling structure according to claim 1, wherein each independent portion is formed in a curved strip having a thickness.

16. The alveolar cooling structure according to claim 1, wherein each contact point is situated in the vicinity of an area with higher temperature.

* * * * *